US008664777B2

United States Patent
Topacio et al.

(10) Patent No.: US 8,664,777 B2
(45) Date of Patent: *Mar. 4, 2014

(54) ROUTING LAYER FOR MITIGATING STRESS IN A SEMICONDUCTOR DIE

(71) Applicant: ATI Technologies ULC, Markham (CA)

(72) Inventors: Roden Topacio, Markham (CA); Gabriel Wong, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/647,052

(22) Filed: Oct. 8, 2012

(65) Prior Publication Data

US 2013/0032941 A1 Feb. 7, 2013

Related U.S. Application Data

(63) Continuation of application No. 13/092,519, filed on Apr. 22, 2011, now Pat. No. 8,299,632, which is a continuation-in-part of application No. 12/604,584, filed on Oct. 23, 2009, now Pat. No. 8,227,926.

(51) Int. Cl.
*H01L 23/48* (2006.01)
*H01L 23/52* (2006.01)
*H01L 29/40* (2006.01)

(52) U.S. Cl.
USPC .......................................... 257/786; 257/781

(58) Field of Classification Search
USPC ........... 257/786, 773, 780, 781; 438/613, 669
See application file for complete search history.

(56) References Cited

U.S. PATENT DOCUMENTS

| 6,407,459 | B2 | 6/2002 | Kwon et al. |
| 6,864,565 | B1 * | 3/2005 | Hool et al. ............... 257/666 |
| 8,227,926 | B2 * | 7/2012 | Topacio et al. ........... 257/786 |
| 8,299,632 | B2 * | 10/2012 | Topacio et al. ........... 257/786 |
| 2004/0046250 | A1 * | 3/2004 | Chua et al. ............... 257/723 |
| 2008/0265408 | A1 * | 10/2008 | Kaufmann et al. ......... 257/723 |
| 2009/0057887 | A1 | 3/2009 | Mclellan |
| 2009/0057889 | A1 | 3/2009 | Murugan |
| 2009/0267213 | A1 | 10/2009 | Lin |
| 2009/0289362 | A1 * | 11/2009 | Rhyner et al. ............. 257/738 |
| 2009/0294958 | A1 * | 12/2009 | Hu ........................... 257/737 |
| 2010/0187688 | A1 | 7/2010 | Hochstenbach |
| 2010/0244239 | A1 | 9/2010 | Bao et al. |
| 2010/0244241 | A1 | 9/2010 | Marimuthu et al. |

FOREIGN PATENT DOCUMENTS

EP    1176637 A1    1/2002

OTHER PUBLICATIONS

International Search Report; PCT Application No. PCT/CA2010/001670; dated Feb. 3, 2011.
Written Opinion; PCT Application No. PCT/CA2010/001670; dated Feb. 3, 2011.

(Continued)

*Primary Examiner* — S. V. Clark
(74) *Attorney, Agent, or Firm* — Faegre Baker Daniels LLP

(57) ABSTRACT

A routing layer for a semiconductor die is disclosed. The routing layer includes traces interconnecting integrated circuit bond-pads to UBMs. The routing layer is formed on a layer of dielectric material. The routing layer includes conductive traces arranged underneath the UBMs as to absorb stress from solder bumps attached to the UMBs. Traces beneath the UBMs protect parts of the underlying dielectric material proximate the solder bumps, from the stress.

16 Claims, 8 Drawing Sheets

(56) References Cited

OTHER PUBLICATIONS

International Search Report and Written Opinion; PCT Application No. PCT/CA2012/000371; dated Jul. 13, 2012.

Clark, Sheila V., USPTO Communication, dated Mar. 26, 2012, in related U.S. Appl. No. 12/604,584, filed Oct. 23, 2009.

Clark, Sheila V., USPTO Communication, dated Nov. 8, 2011, in related U.S. Appl. No. 12/604,584, filed Oct. 23, 2009.

Clark, Sheila V., USPTO Communication, dated May 26, 2011, in related U.S. Appl. No. 12/604,584, filed Oct. 23, 2009.

Clark, Sheila V., USPTO Communication, dated Aug. 30, 2012, in related U.S. Appl. No. 13/092,519, filed Apr. 22, 2011.

Clark, Sheila V., USPTO Communication, dated Jun. 26, 2012, in related U.S. Appl. No. 13/092,519, filed Apr. 22, 2011.

Clark, Sheila V., USPTO Communication, dated Jan. 3, 2012 in related U.S. Appl. No. 13/092,519, filed Apr. 22, 2011.

Clark, Sheila V., USPTO Communication, dated Jun. 26, 2012 in related U.S. Appl. No. 13/092,519, filed Apr. 22, 2011.

Clark, Sheila V., USPTO Communication, dated Aug. 30, 2012 in related U.S. Appl. No. 13/092,519, filed Apr. 22, 2011.

Clark, Sheila V., USPTO Communication, dated Dec. 11, 2012 in related U.S. Appl. No. 13/533,222, filed Jun. 26, 2012.

\* cited by examiner

ROUTING LAYER FOR MITIGATING STRESS IN A SEMICONDUCTOR DIE

CROSS REFERENCE TO RELATED APPLICATIONS

This application is a continuation of U.S. patent application Ser. No. 13/092,519, filed Apr. 22, 2011, which is a continuation-in-part of U.S. patent application Ser. No. 12/604,584, now U.S. Pat. No. 8,227,926, filed Oct. 23, 2009, all owned by instant assignee and are hereby incorporated by reference.

FIELD OF THE INVENTION

The present invention relates generally to semiconductor dice, and more particularly to routing layer design for a semiconductor die.

BACKGROUND OF THE INVENTION

Modern semiconductor packages are manufactured by forming a number of integrated circuits on a semiconductor wafer. The wafer is typically diced—cut into individual pieces—each of which is called a die. Each die includes one or more integrated circuits on one surface. This surface (often referred to as the "active surface") includes a number of signal interface contacts called input-output (I/O) pads.

A die is typically packaged using a carrier substrate that includes solder balls suitable for attachment onto an external circuit board. The carrier substrate usually includes a core and one or more buildup layers formed on either side of the core. Each buildup layer has metallization or traces formed on a layer of dielectric material. The carrier substrate includes bond-pads for electrical interconnection with I/O pads of the die. Traces on the substrate are used to interconnect individual bond-pads with their corresponding solder balls.

A variety of bonding techniques may be used to form reliable electrical connections between I/O pads on the die and the bond-pads on the substrate. Two of the most popular techniques are wire-bonding and flip chip assembly.

In wire-bonding, the die is placed on the carrier substrate, with its active surface facing away from the carrier substrate. Wires are then bonded to I/O pads on the die at one end, and corresponding bond-pads on the substrate at the other end.

In flip chip assembly however, the active surface of the die faces the carrier substrate when the die is attached. Small amounts of solder called solder bumps are deposited on each I/O pad prior to attachment. The solder bumps are then melted to interconnect each I/O pad on the die to a corresponding bond-pad on the substrate.

I/O pads on a die may be placed anywhere over the active surface of the die. For example, in some dice, I/O pads may be distributed all over the active surface while in others the I/O pads may be restricted to near the peripheral boundaries of the die. In either case, I/O pads on a die are typically not aligned with the bond-pads on a substrate, to which they are ultimately attached. The I/O pads may also be too close to each other to allow proper solder bump formation, as is required during flip chip assembly. As a result, it is often advantageous to redistribute these original I/O pads to new pad locations (called bump-pads) that are better suited for solder bump formation. The bump-pads can then be aligned with bond-pads on a substrate and attached using solder bumps. To redistribute the original I/O pads to new bump-pad locations suitable for flip-chip bonding, a routing layer or a redistribution layer (RDL) is typically formed over the silicon wafer, or an individual die, on the active surface.

The routing layer is often formed on a thin dielectric layer, on which conductive traces are formed to interconnect each I/O pad to a corresponding bump-pad. The traces are insulated from the lower layers of the die by the dielectric material, except at the I/O pads where they interconnect. The routing layer allows I/O drivers to be placed anywhere in the die, without having to consider positions of the substrate bond-pads. I/O drivers may thus be freely placed in the die, as the redistribution layer would align the solder bumps formed on its bump-pads with bond-pads on the substrate. The use of a routing layer also simplifies the formation of substrates, and often leads to fewer buildup layers, which reduces cost.

The routing layer may include multiple layers of dielectric materials and associated traces depending on routing needs. A passivation layer is often formed over the top routing layer, to protect metal traces from exposure to air. Openings in the passivation layer expose the bump-pads.

Under bump metallization (UBM) are typically formed on the exposed bump-pads to provide low resistance electrical connections to solder bumps, for attachment to the substrate. A solder bump is typically formed on the UBM of the bump-pad for example by deposition of solder paste.

During flip-chip attachment, the solder bumps formed on the redistributed bump-pads are aligned with corresponding bond-pads in the substrate, and then reflowed or melted to form reliable electrical and mechanical contacts.

After a semiconductor die is attached to a substrate, its solder bumps are often subjected to mechanical and thermal stress during operation. Each bump-pad helps absorb much of the stress that would otherwise impact the underlying dielectric layer in the routing layer. To buffer such stress from solder bumps, each bump-pad is often made at least as large as (and often substantially larger than) its corresponding UBM.

However, this is disadvantageous as larger bump-pads reduce the area available for routing conductive traces in the routing layer, leading to a denser arrangement of traces and bump-pads which can potentially compromise signal integrity. Moreover traces that must be routed around large bump-pads may need to be made longer, which increases their resistance and capacitance. Increased resistance and capacitance on traces, often leads to voltage drops in power traces and longer propagation delays in signal traces. In addition, newer, smaller dice often require much smaller bump-pads to increase the available area for their routing needs, and often use brittle dielectric materials.

One known method for reducing bump-pad sizes is the use of Polyimide between a large UBM formed atop a small bump-pad to assist in mitigating stress that may affect dielectric layers of the die. Unfortunately however, this adds to packaging cost and may not work well with brittle dielectric layers.

Accordingly, there is a need for semiconductor die that allows an increase in the number of traces without compromising signal integrity, and protect dielectric layers against thermal and mechanical stress.

SUMMARY OF EMBODIMENTS OF THE INVENTION

In accordance with one aspect of the present invention, there is provided a semiconductor die including: an integrated circuit formed on one surface of a piece of semiconductor wafer; a plurality of input-output (I/O) pads interconnected to the integrated circuit; and a routing layer. The routing layer includes: a dielectric layer formed on one surface; and a plurality of conductive traces formed on the dielectric layer, each of the conductive traces extending between one of the I/O pads and one of a plurality of bump-pads formed on the dielectric layer. The semiconductor die also includes a plurality of under-bump metallizations (UBMs), each having a top surface for attaching a respective one of a plurality of solder bumps; and a bottom contact surface smaller than the top surface, in physical contact with a respective one of the bump-pads. At least some of the conductive traces pass proximate the bump-pads without contacting the bump-pads, beneath a top surface of one of the UBMs, to mechanically reinforce the routing layer proximate one of the UBMs.

In accordance with another aspect of the present invention, there is provided a semiconductor die including: at least one integrated circuit formed on one surface, and a plurality of input-output (I/O) pads connected to the integrated circuit; a routing layer including a dielectric layer formed on the surface of the die, and a plurality of conductive traces formed on the dielectric layer, each of the conductive traces extending between one of the I/O pads and one of a plurality of bump-pads formed on the dielectric layer; and a plurality of solder bumps formed on the bump-pads, for electrically interconnecting the integrated circuit to a substrate. At least one of the bump-pads is contained within a circular circumscribing area having a radius greater than or equal to the mean radius of a top surface of a corresponding under-bump metallization (UBM) formed on the each bump-pad. At least some of the conductive traces pass through the circular circumscribing area without contacting a contained bump-pad, to mechanically reinforce the routing layer proximate the contained bump-pad.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
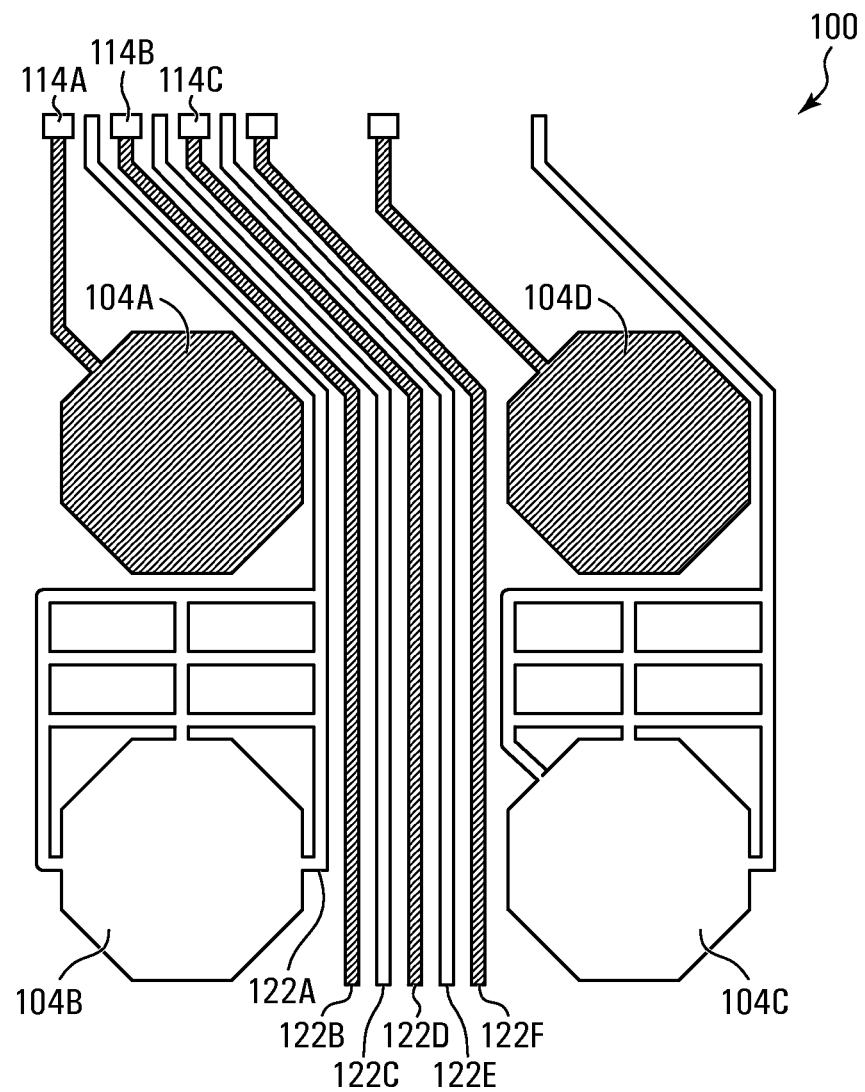
FIG. 1 is a plan view of a conventional routing layer for a conventional semiconductor die that redistributes I/O pads to bump-pads.

FIG. 1 depicts a plan view of the routing layer of a conventional semiconductor die 100. Die 100 includes original I/O pads 114A, 114B, 114C (individually and collectively I/O pads 114) forming part of its integrated circuit, and redistributed bump-pads 104A, 104B, 104C, 104D (individually and collectively bump-pads 104) suitable for flip chip solder bump formation. Conductive traces 122A, 122B, 122C, 122D, 122E, 122F (individually and collectively conductive traces 122), interconnect I/O pads 114 to corresponding bump-pads 104.

Figure 2:
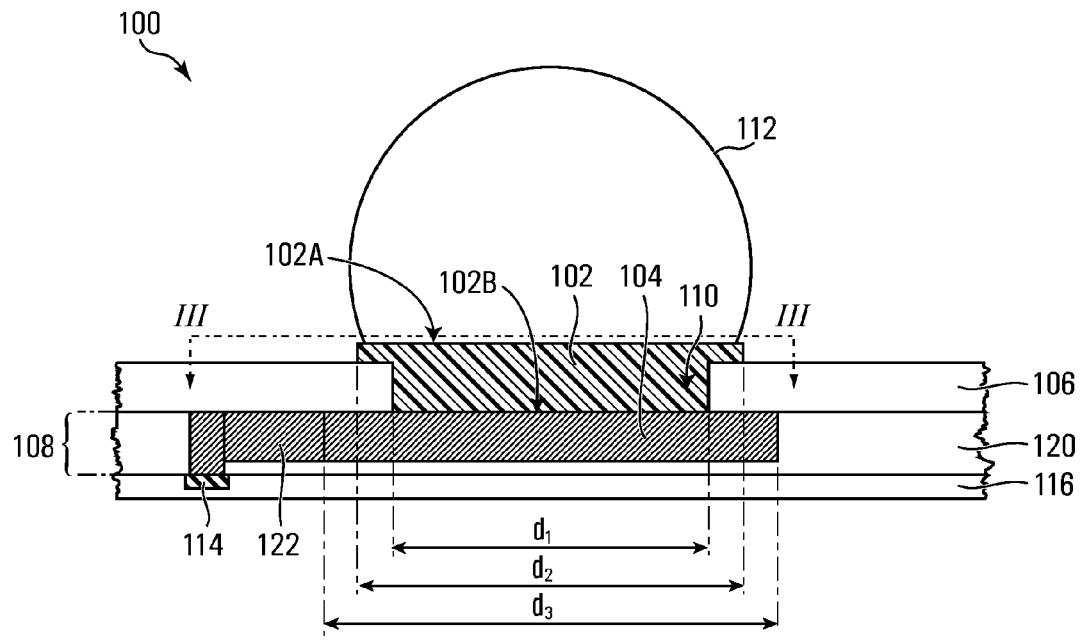
FIG. 2 is a vertical cross-sectional view of a conventional semiconductor die.

FIG. 2 depicts a vertical cross-sectional view of a portion of conventional semiconductor die 100, including conductive trace 122, I/O pad 114, and bump-pad 104 with a solder bump 112 formed thereon. I/O pad 114 is formed on a lower metal layer 116 of die 100 which includes an integrated circuit formed on a piece of semiconductor wafer (e.g., silicon wafer).

Bump-pads 104 provide I/O connection points to the integrated circuit. Solder bumps 112 formed on bump-pads 104 are used to attach the 100 to a substrate such as a carrier substrate or a printed wiring board, using flip-chip attachment techniques.

A routing layer 108, formed over lower metal layer 116 includes dielectric layer 120 and conductive traces 122 formed thereon. Dielectric layer 120 insulates lower metal layer 116 from conductive traces 122, except at the I/O pads 114. Each one of conductive trace 122 interconnects an I/O pad 114 to a bump-pad 104.

Under-bump metallization (UBM) 102, formed on each of bump-pads 104, provides a low resistance attachment surface for each of solder bumps 112. Each UBM 102 may have a top surface 102A in communication with solder bump 112 and a bottom contact surface 102B in communication with bump-pad 104.

To interconnect die 100 to a substrate, solder bumps 112 are aligned with bond-pads on the substrate and melted using heat to form electrical and mechanical bonds with the substrate.

During operation, semiconductor die 100 consumes electrical energy in the form of a voltage or current input, and dissipates some of that energy as heat. Heat causes both die 100 and the substrate to which it is attached, to expand at their respective coefficients of thermal expansion (CTE). The CTE of die 100 and the CTE of the substrate (to which die 100 is interconnected via solder bumps 112) are often different. This mismatch in CTE values causes thermal stress on solder bumps 112 and other nearby structures such as UBM 102 and dielectric material 120 in routing layer 108. In addition to thermal stress, structures proximate solder bumps 112 may also be subjected to mechanical stress resulting from flexing and/or vibration of either the substrate or die 100.

Thermal and/or mechanical stress could potentially damage routing layer 108 (specifically, dielectric material 120) and other materials used in lower layer 116. For example, extreme low K (ELK) dielectric materials (having dielectric constant values of κ<3.0) may be used in lower layer 116. However, ELK materials tend to be brittle, and may warp, crack or break under mechanical or thermal stress. Dielectric materials that are not necessary ELK may also be damaged from exposure to thermal and mechanical stress.

To mitigate the effects of stress on the dielectric material 120 of routing layer 108 and lower layer 116, bump-pads 104 are often made larger than UBM 102. Large bump-pads help absorb stresses that would otherwise impact the underlying dielectric material.

Figure 3:
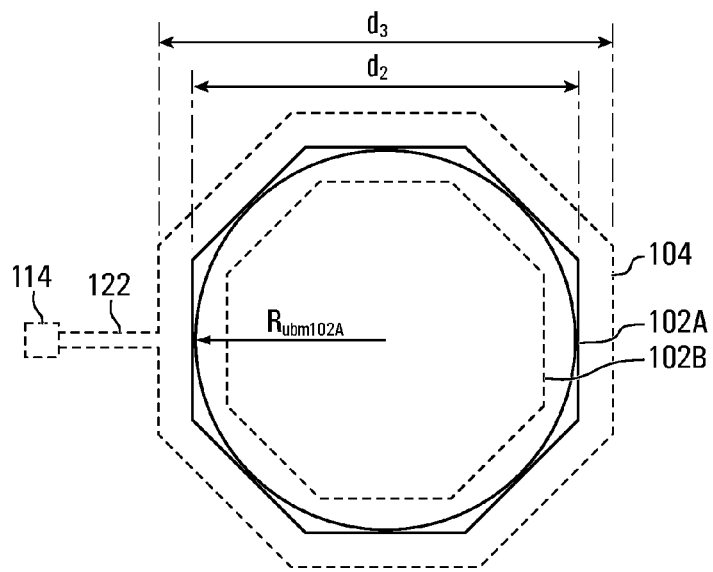
FIG. 3 is a plan view of a portion of the conventional semiconductor die of FIG. 2.

The relative sizes of the surfaces of UBM 102 and bump-pad 104 are illustrated in FIG. 3, which depicts a plan view of a portion of conventional die 100 taken along the line III-III in FIG. 2. As shown, conventional bump-pad 104 is larger than UBM 102 and thus helps absorb mechanical and thermal stress from a corresponding solder bump (not shown in FIG. 3), thereby preventing damage to dielectric material 120 and lower layer 116.

Unfortunately, larger bump-pads 104 reduce available area that may be used for routing conductive traces 122 within routing layer 108. In addition, some traces need to be long, in order to be routed around larger pads 104. As noted, long traces contribute to increased resistance and capacitance, which in turn lead to voltage drops along power traces, and increased propagation delays across signal traces. Further, integrated circuits formed using process technologies of 45 nm or lower are typically small in size, and often packaged with ELK dielectric materials. Large bump-pads such as bump-pad 104 may not be suitable for such devices.

Accordingly, exemplary embodiments of the present invention may utilize smaller sized bump-pads suitable for use with ELK dielectric materials. Smaller pad sizes may free up space allowing increased density of power and ground traces within a give area. Conversely, newly freed up space, permits increased spacing between parallel traces which may decrease crosstalk. As may be appreciated, reduced crosstalk, and/or increased power and ground traces, help improve signal integrity and increase performance.

Figure 4:
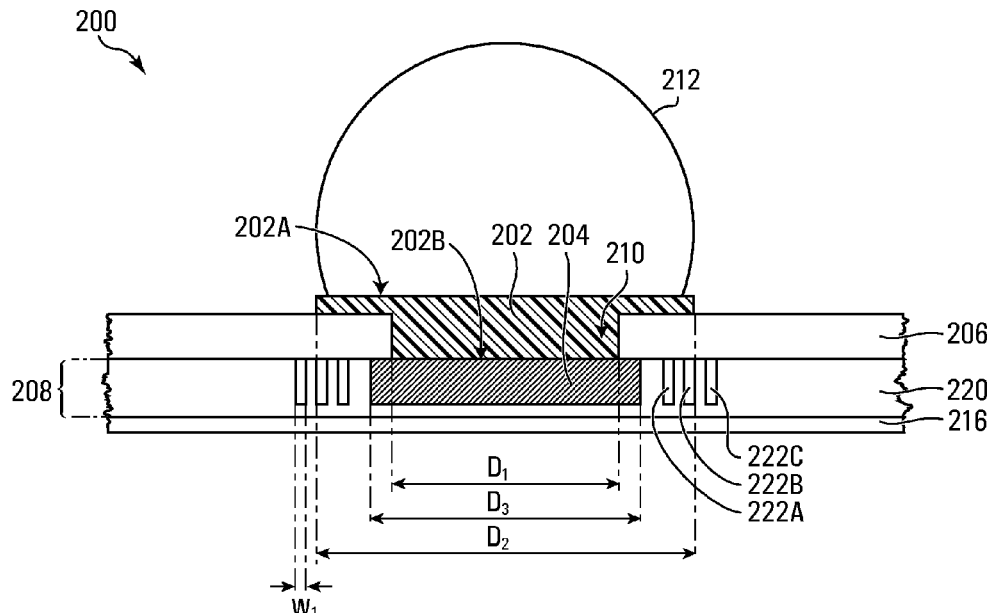
FIG. 4 is a vertical cross-sectional view, of a portion of a semiconductor die exemplary of an embodiment of the present invention.
Figure 5:
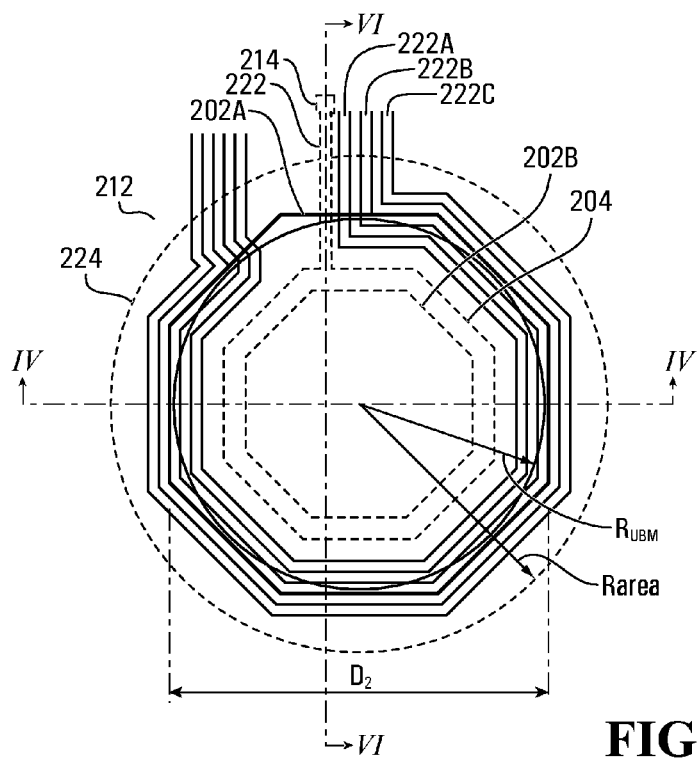
FIG. 5 is a plan view of a portion of the exemplary semiconductor die depicted in FIG. 4.

Accordingly, FIG. 4 depicts a vertical cross-section of a semiconductor die 200 exemplary of an embodiment of the present invention. FIG. 5 depicts a plan view of the portion of exemplary the 200 in FIG. 4. As depicted, exemplary the 200 includes an integrated circuit (IC) formed on a piece of semiconductor wafer (e.g., silicon wafer or Gallium Arsenide wafer) and I/O pads 214 interconnected to the IC, which may be made of, for example, aluminum (Al) or copper (Cu).

Die 200 may also include a routing layer 208 made up of one or more layers of dielectric material 220, each having a layer of conductive traces 222A, 222B, 222C (individually and collectively conductive traces 222) formed thereon. Die 200 may include a protective cover such as passivation layer 206, to shield conductive traces 222 from exposure to air, thereby preventing oxidation. Conductive traces 222 may interconnect I/O pads 214 to corresponding ones of bump-pads 204.

A plurality of solder bumps 212 may be formed, each on one of bump-pads 204. Solder bumps 212 may be used to attach die 200 to a substrate using flip chip attachment methods. Solder bumps 212 may be aligned to corresponding bond-pads on the substrate, and reflowed to form electrical and mechanical bonds. Flip chip attachment methods are well known to persons of ordinary skill in the art.

Each conductive trace 222 may connect I/O pad 214 at one end to a corresponding bump-pad 204 (and thus a solder bump 212). Conveniently, bump-pads 204, provide I/O interconnection to the integrated circuit on die 200.

As may be appreciated, it may be advantageous to design the placement of I/O pads 214 and associated I/O driver circuitry, free of considerations of bump-pad placement, so as not to interfere with other optimizations. I/O pads 204 may be area pads, multi-row pads, perimeter pads, or the like. Regardless of the locations of I/O pads 204, routing layer 208 may be used to redistribute I/O pads 214 to bump-pads 204 to align solder bumps 212 with respective bond-pads on a substrate.

Conductive traces 222 are typically made of copper or aluminum; but may also be made of other metals such as gold, lead, tin, silver, bismuth, antimony, zinc, nickel, zirconium, magnesium, indium, tellurium, gallium, and the like. Alloys of one or more of the above metals may also be used.

Under-bump metallization (UBM) 202 may be formed on each of bump-pads 204 to provide a low resistance mounting surface to solder bumps 212. For example, in one embodiment, a solder paste may be deposited on each UBM 202 to form each solder bump 212.

Each UBM 202 may have a top surface 202A in communication with a corresponding solder bump 212 and a bottom contact surface 202B in communication with a respective bump-pad 204 underneath. UBM 202 may include several sub-layers (not shown) such as an adhesion sub-layer, a diffusion barrier sub-layer, a solder-wettable sub-layer and optionally an oxidation barrier sub-layer, between its top surface 202A and its bottom contact surface 202B. Bottom contact surface 202B is in physical contact with bump-pad 204.

Formation of UBM 202 may include cleaning, insulating oxide removal, and depositing metallurgy that makes good electrical and mechanical connection to solder bumps 212. The solder wettable sub-layer offers an easily wettable surface to the molten solder, for good bonding of solder bumps 212 to the underlying bump-pad 204. Solder bumps 212 (like solder bumps 112 of FIG. 2), may be melted using heat, to form electrical and mechanical interconnections between semiconductor the 200 and a substrate or circuit board.

As will be detailed below, bump-pads 204 of the 200 are smaller than bump-pads 104 of die 100. Consequently, routing layer 208 provides more room or added space for routing conductive traces 222 which may lead to shorter lengths. Shorter traces are advantageous as this leads to reduced trace resistance and capacitance. Reduced resistance and capacitance values, in turn, lead to reduced voltage drops across power traces, and smaller signal propagation delays along signal traces.

Figure 6:
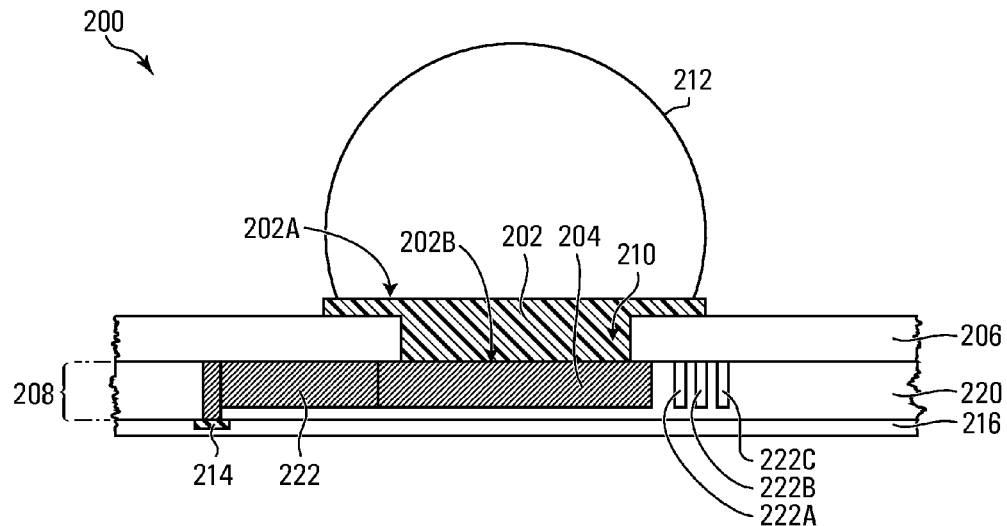
FIG. 6 is another cross-sectional view of the exemplary semiconductor die of FIG. 4.

FIG. 6 depicts a vertical cross section of semiconductor die 200 taken along line VI-VI in FIG. 5. As depicted in FIG. 6, exemplary bump-pad 204 is smaller than its corresponding UBM 202. Exemplary bump-pad 204 interconnects I/O pad 214 by way of metal trace 222.

Comparing FIG. 2 with FIG. 4, (or FIG. 3 with FIG. 5), it may be observed that the smaller bump-pad 204, permits routing a number of conductive traces 222A, 222B, and 222C (individually and collectively conductive traces 222) within about the same area as is occupied by bump-pad 104. The relative sizes of bump-pad 104 and bump-pad 204 are further depicted in FIG. 7 and FIG. 9.

Now, to mitigate the effects of stress on the dielectric material in routing layer 208 that may result from the reduced size for bump-pads 204; one or more of traces 222 may be routed near bump-pads 204 in ways that help absorb mechanical and/or thermo-mechanical stress.

Specifically, in the specific embodiment depicted in FIGS. 4-6, conductive traces 222A, 222B, 222C pass proximate bump-pad 204 to mechanically reinforce routing layer 208 proximate UBM 202. Portions of conductive traces 222A, 222B, that surround or pass proximate bump-pad 204 may be beneath top surface 202A of UBM 202 but not beneath bottom contact surface 202B in physical contact with bump-pad 204. Conductive traces 222A, 222B thus reinforce routing layer 208 proximate UBM 202. Portions of conductive traces 222A, 222B passing proximate bump-pad 204 may therefore absorb mechanical and/or thermal stress from a solder bump attached to bump-pad 204, to protect the underlying dielectric material 220 proximate solder bump 212.

As depicted in FIG. 5, each of bump-pads 204 may be contained within a circular circumscribing area 224 having a radius $R_{area}$ no shorter than the mean radius $R_{UBM}$ of the top surface UBM 202A (i.e., $R_{area} \geq R_{UBM}$ where $R_{UBM} = D_2/2$). As will be detailed later, at least some of the conductive traces (e.g., traces 222A, 222B) may pass through circular circumscribing area 224 without directly contacting the bump-pad contained therein to mechanically reinforce routing layer 208 proximate the contained bump-pads.

Bump-pad 204 and portions of conductive traces 222A, 222B, 222C inside circular circumscribing area 224 may be viewed as a "virtual pad", having an effective size (from a stress absorption standpoint), as large as a conventional bump-pad 104. Circumscribing area 224 can effectively buffer stress from a corresponding solder bump (formed on UBM surface 202A on a circumscribed bump-pad 204) thereby protecting the underlying dielectric material from stress induced damage. Of course in other embodiments, circular circumscribing area 224 may be the same, larger or even slightly smaller in size than conventional bump-pad 104.

To compare relative sizes of pads, UBMs and circumscribing areas of different shapes, the diameter of a circle inscribed within a given shape may be taken to be representative of the size of the shape.

In FIG. 2, the diameter of a circle inscribed in the top surface 102A of UBM 102 may be about 80 μm (i.e., $d_2 \approx 80$ μm). In other words, the inradius of UBM top surface 102A is about 80 μm/2=40 μm. The diameter of a circle inscribed within bump-pad 104 may be about 92 μm (i.e., $d_3 \approx 92$ μm); and the diameter of a circle inscribed within opening 110 (or within bottom contact surface 102B, and denoted $d_1$) may be about 60 μm (i.e., $d_1 \approx 60$ μm).

In FIG. 4 however, in one embodiment, the diameter of (a circle inscribed within) top surface 202A of UBM 202 (denoted $D_2$) may be about 80 μm (i.e., $D_2 \approx 80$ μm). The diameter of (a circle inscribed within) bump-pad 204 may be about 50 μm (i.e., $D_3 = 50$ μm in FIG. 4) and the diameter of (a circle inscribed within) opening 210 (denoted $D_1$ in FIG. 4) may be about 46 μm (i.e., $D_1 \approx 46$ μm). The width of each conductive trace 222 (denoted $W_1$) may be about 12 μm. As will be appreciated by those skilled in the art, the above figures are only exemplary, and larger or smaller dimensions may be used in other embodiments.

As well, the shapes UBM surfaces 202A, 202B, bump-pad 204 and opening 210 need be neither uniform nor necessarily octagonal. Instead, UBM 202, bump-pad 204 and passivation opening 210 but may take on any shape and may have varying sizes. They may for example have other polygonal shapes, such as a hexagon or a rectangle. They may also take on other shapes: they may be circular, elliptic, irregular shapes or any arbitrary shape of suitable size.

The arrangement of conductive traces 222A, 222B, 222C, around or surrounding bump-pad 204 in exemplary routing layer 208 is advantageous. In addition to permitting an added number of signal routing traces with in a given area, the arrangement creates stress buffering zone in the form of circular circumscribing area 224 which may effectively provide as much protection against stress, as the much larger conventional bump-pad 104. As may be appreciated stress is absorbed by parts of conductive traces 222A, 222B, 222C proximate bump-pad 204 (in area 224) that could otherwise damage the underlying dielectric material of routing layer 208.

Figure 7:
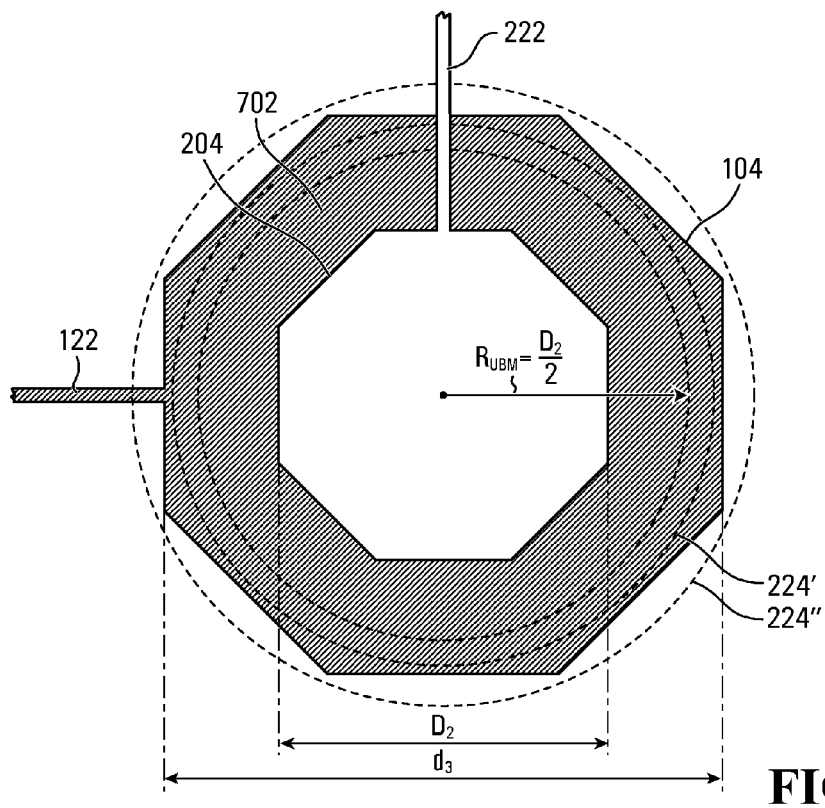
FIG. 7 is a diagram depicting relative sizes of the exemplary bump-pad of FIG. 5 and the conventional bump-pad of FIG. 4.

FIG. 7 depicts the relative sizes of exemplary bump-pad 204 and conventional bump-pad 104, and exemplary circular circumscribing areas representative of outlines for various stress buffering zones. Area 702 corresponds to the difference in surface area between the larger conventional bump-pad 104 and a concentrically located, smaller exemplary bump-pad 204. In conventional bump-pad 104, none of area 702 (which forms part of bump-pad 104) can be used for routing. Conveniently, parts of area 702 may be used for routing traces in exemplary embodiments that utilize bump-pads 204.

Conversely however, while all of area 702 helps absorb stress in conventional pads such as bump-pad 104, in exemplary embodiments of the present invention only portions of area 702 that are taken up by traces absorb stress to reinforce routing layer 208. To increase stress absorption within area 702, exemplary embodiments may increase the percentage of area 702 covered by conductive traces.

In exemplary routing layer 208, the stress buffering zone (area of stress absorption) need not be confined to area 702. It may instead be smaller or larger than area 702. Accordingly, a stress buffering area may be defined by a first circular circumscribing area 224' containing bump-pad 204 and portions of traces contained therein. As depicted in FIG. 7, circular circumscribing area 224' may be smaller in size than bump-pad 104. However, a stress buffering zone larger than pad 104 may be formed by using more and more traces that surround bump-pad 204 to reinforce routing layer 208. This is exemplified by a second circular circumscribing area 224" depicted in FIG. 7. As may be appreciated, increasing the proportion of surface area of a given circular circumscribing area (e.g., area 224") that is covered by a bump-pad and portions of conductive traces contained therein, provides greater mechanical reinforcement for routing layer 208 proximate the contained bump-pad. In some embodiments, the proportion of area 702 that is covered by conductive traces may be between about 30% and 100%.

Figure 8:
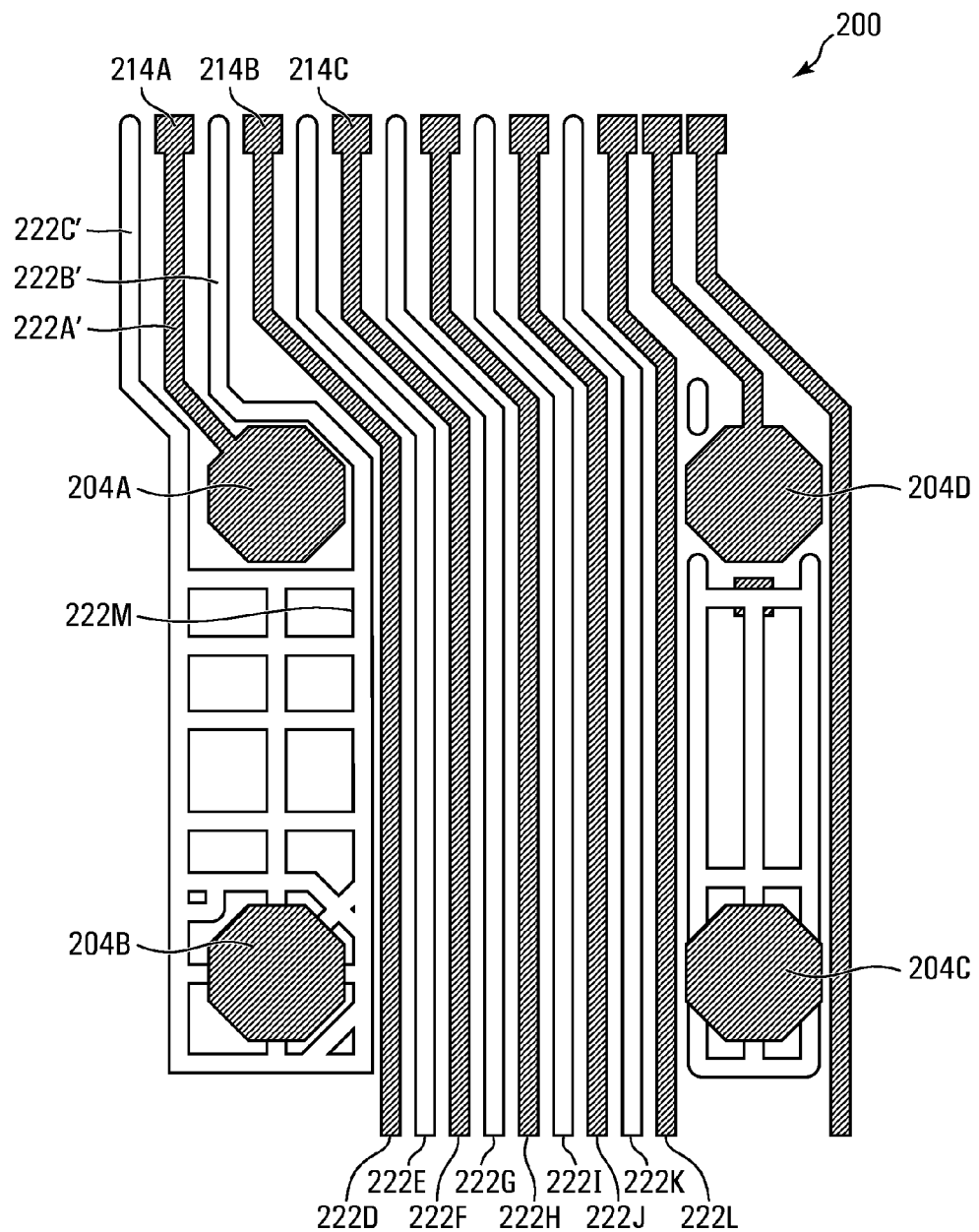
FIG. 8 is a plan view of an exemplary routing layer of the semiconductor die of FIG. 4.

FIG. 8 depicts a plan view of an exemplary routing layer 208 of an exemplary semiconductor die 200. Routing layer 208 includes the original I/O pads 214A, 214B, 214C (individually and collectively I/O pads 214) of the integrated circuit, and redistributed exemplary bump-pads 204A, 204B, 204C, 204D (individually and collectively bump-pads 204) suitable for flip chip solder bump formation. Conductive traces 222D, 222E, 222F, 222G, 222H, 222I, 222J, 222K, 222L (individually and collectively conductive traces 222), are used to interconnect I/O pads to corresponding bump-pads (not all shown).

In FIG. 1, only five signal traces are routed between bump-pads 104A and 104D. However in FIG. 8, at least ten signal, ground and power traces (i.e. 222D, 222E, 222F, 222G, 222H, 222I, 222J, 222K, 222L, and 222M) can be accommodated between bump-pad 204A and bump-pad 204D. As may be observed, the routing layer of FIG. 8 includes many more signal traces between bump-pads, without narrowing the spacing separating neighboring traces, which can promote improved signal density.

In FIG. 8, the depicted conductive pattern for routing layer 208, includes a first conductive trace 222A' interconnecting a first bump-pad 204A for attaching a first solder bump to an I/O pad 214A; and a second conductive trace 222B' interconnecting a second bump-pad 204B for attaching a second solder bump, and a second 110 pad 214B. I/O pads 214 may have any shape and may be placed anywhere on die 200.

Figure 9:
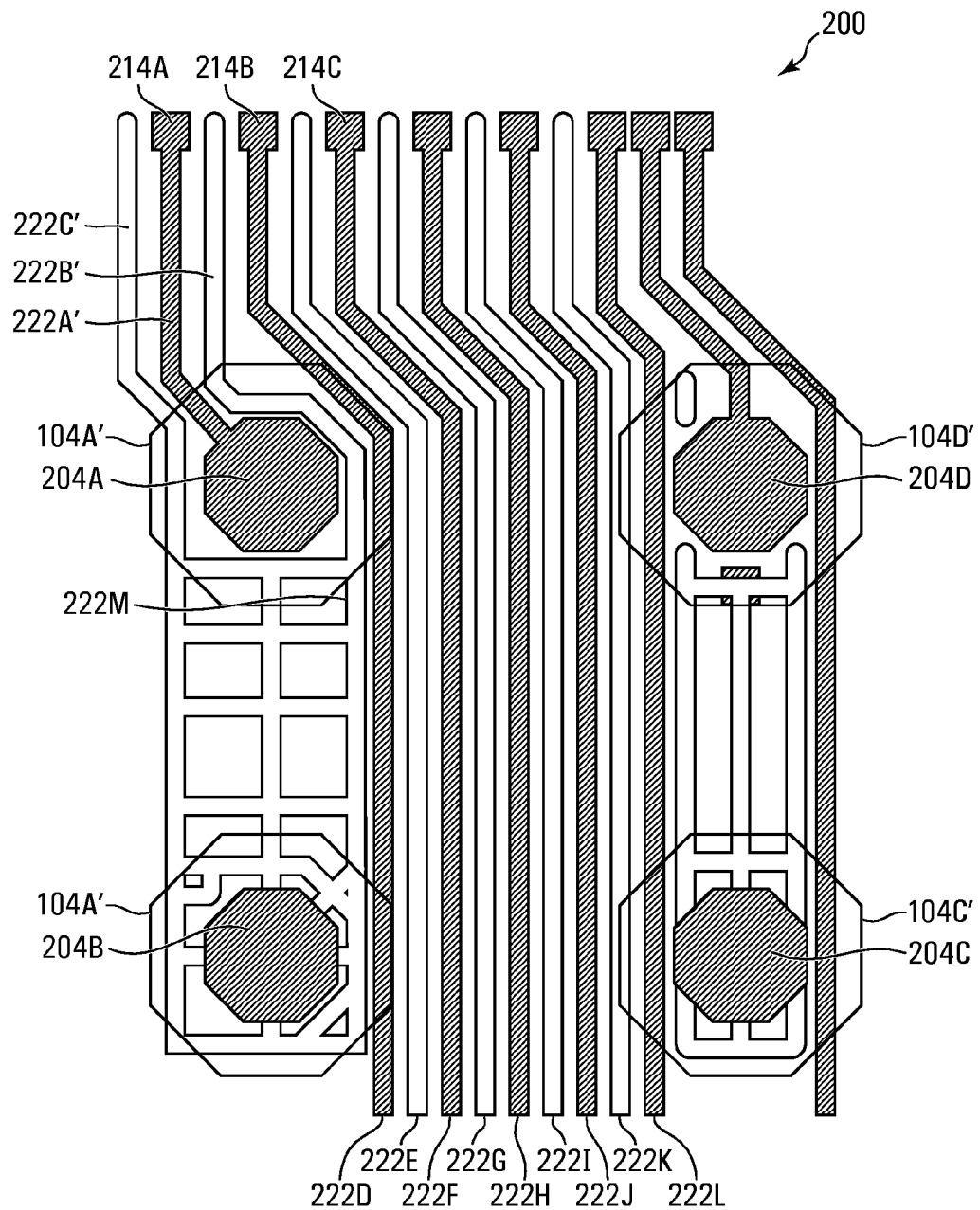
FIG. 9 is the plan view of FIG. 8, with overlays of conventional bump-pads drawn for purposes of comparison with exemplary bump-pads.

FIG. 9, also depicts a plan view of an exemplary routing layer 208 of an exemplary semiconductor die 200, with outlines of conventional hypothetical bump-pads 104A', 104B', 104C', 104D' (individually and collectively pad outlines 104')

shown to illustrate the relative size and routing density achieved by exemplary routing layer 208.

As depicted, portions of conductive trace 222B', 222C' (e.g., portions within pad outline 104A') at least partially surround or pass proximate bump-pad 204A. Portions of trace 222A', 222B', 222C' near bump-pad 204A thus absorb stress from a solder bump attached to bump-pad 204A. The depicted arrangement effectively forms a "virtual pad" or a circumscribing area (e.g., outline 104A' or an inscribed circle within) that encloses pad 204A, to protect the dielectric layer proximate pad 204A from potential damage caused by thermal and mechanical stress.

FIGS. 8-9 also depict additional pads 204C and 204B each interconnected to individual respective traces. As depicted, although conductive traces 222B', 222C' do not directly interconnect bump-pad 204A, portions of conductive traces 222B', 222C' help protect the dielectric layer proximate pad 204A.

Advantageously, costly additional steps are not required to manufacture semiconductor die 200. For example, one method of manufacturing a semiconductor die such as die 200 may include preparing a wafer that has at least one integrated circuit (IC) including a set of I/O pads formed on the active surface. A routing layer such as routing layer 208 that includes a layer of dielectric material may be formed on the wafer. The routing layer may have at least one conductive trace formed thereon, interconnecting a first pad (e.g. bump-pad 204), to a first I/O pad. The routing layer may also include a second bump-pad, a second I/O pad and a second conductive trace interconnecting the second bump-pad to the second I/O pad. The second conductive trace (e.g., trace 222B') may be formed so as to pass proximate the first bump-pad (e.g., bump-pad 204A in FIG. 8) and may also partially surround the first bump-pad. The second conductive trace may thus buffer stress from a solder bump attached to the first bump-pad, to protect the underlying dielectric material proximate the solder bump, from the stress.

A passivation layer may also be formed. The manufacturing method may further involve forming openings on the passivation layer to expose the bump-pads and forming under bump metallization (UBM) pads on each bump-pad to mount, deposit or attach solder bumps onto the bump-pads.

The method may further involve attaching die 200 onto a carrier substrate using flip chip attachment. Flip chip attachment is well known to those of ordinary skill in the art and is discussed for example in Harper, Charles A. 2005, *Electronic Packaging and Interconnection*, 4th ed. New York: McGraw Hill, the contents of which are hereby incorporated by reference.

Figure 10:
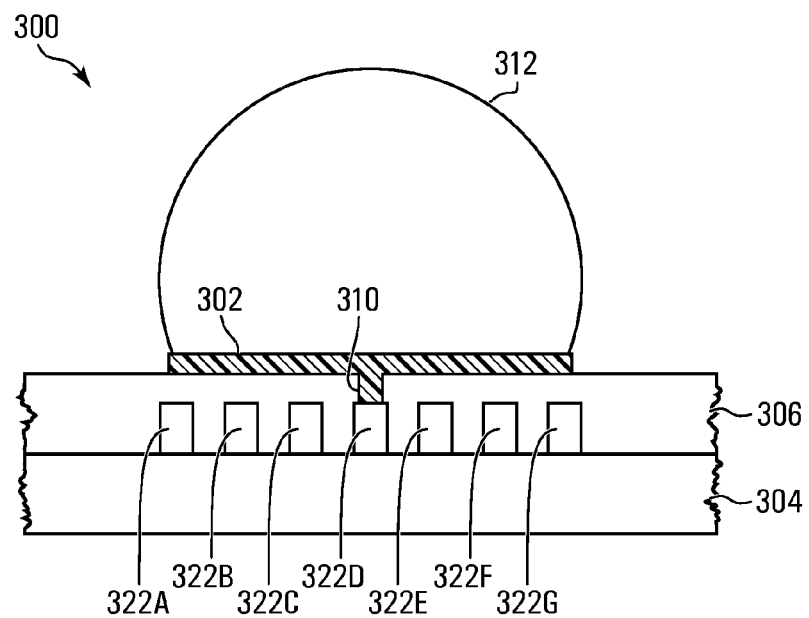
FIG. 10 is a vertical cross-sectional view, of a portion of a semiconductor die exemplary of an embodiment of the present invention.
Figure 11:
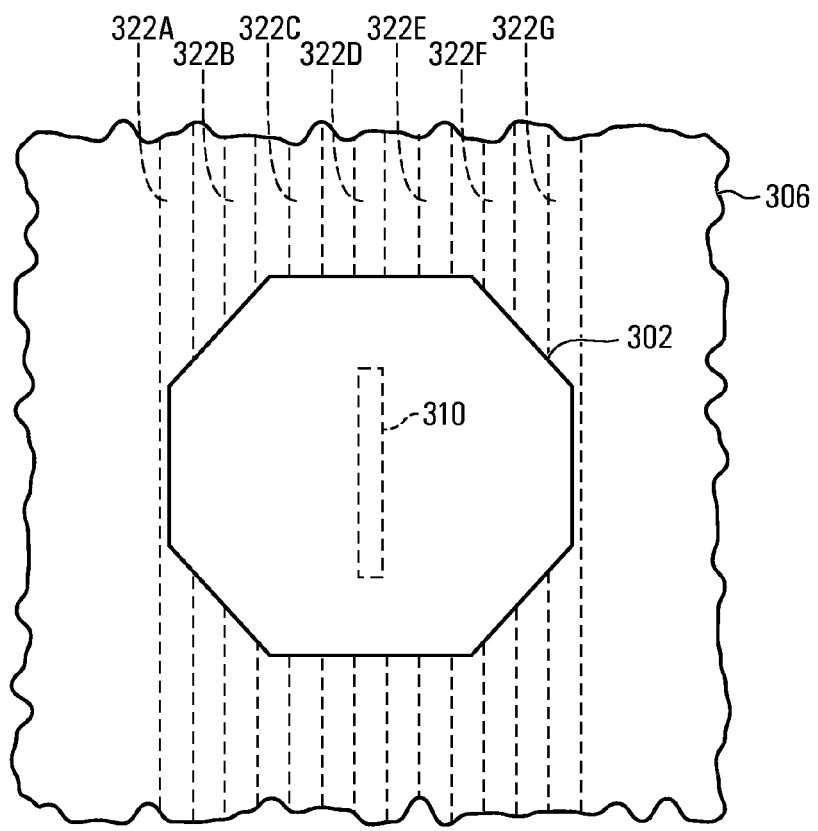
FIG. 11 is a plan view of a portion of the exemplary semiconductor die depicted in FIG. 10.
Figure 12:
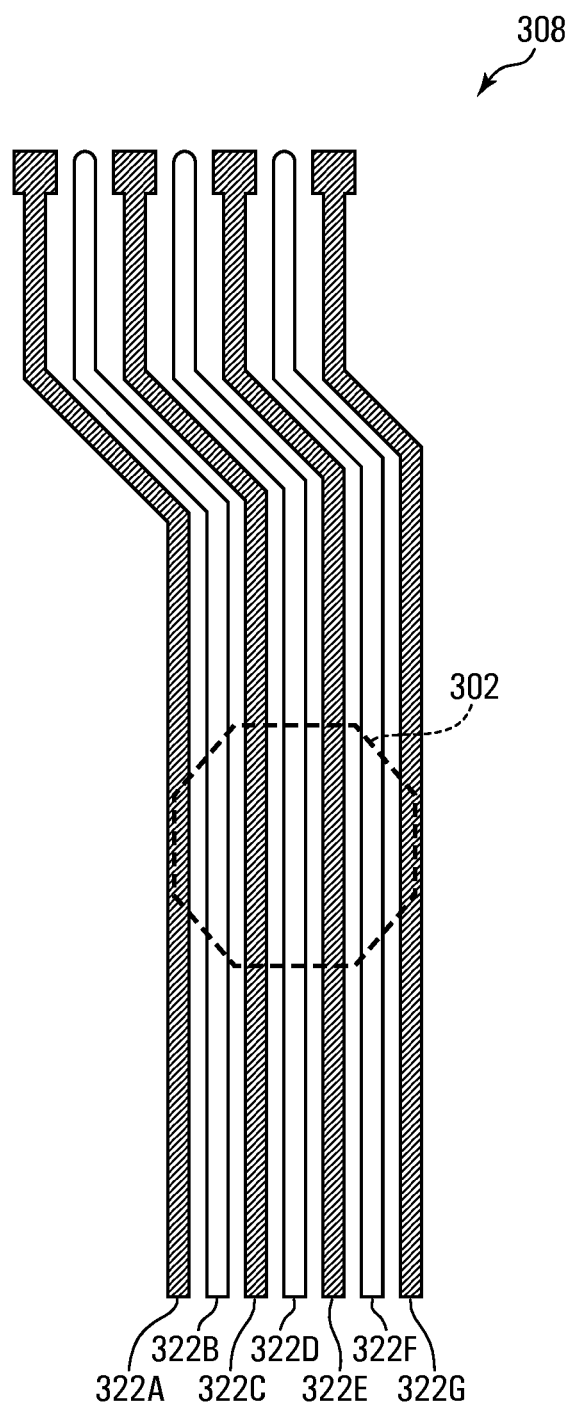
FIG. 12 is a plan view of the routing layer of the semiconductor die of FIG. 10.

FIGS. 10 to 12 illustrate a portion of a further semiconductor die 300, exemplary of another embodiment of the present invention. As illustrated, a semiconductor die 300 includes a routing layer 308 including a plurality of conductive traces 322a, 322b, ... 322g (individually and collectively conductive trace 322). Routing layer 308 may include dielectric 306, formed atop a lower metal layer 304. UBM 302 allows attachment of die 300 to a substrate or the like by way of solder bump 312 (FIG. 10). Each conductive trace 322a, 322b, 322c ..., 322g, like conductive trace 222 (FIGS. 4-9), may emanate with an I/O pad 314a, 314b, ... 314g (FIG. 12) on an IC of semiconductor die 300, and carry signals, power and the like from and to the IC. However, unlike in the embodiments of FIGS. 4-9, conductive trace 322d plays the role of the bump-pad for UBM 302. In this way, UBM 302 may extend directly from a contact point on one of the plurality of conductive traces that acts as, or in place of, a conventional bump pad (like bump pad 104) for the UBM 302. Trace 322d may extend beyond UBM 302 and to another UBM (not shown), or other termination point.

In particular, as illustrated in FIG. 10, UBM 302 may be electrically interconnected to a trace 322 by way of a metalized via 310 that extends through dielectric 306. Again as illustrated, a plurality of other traces 322 running generally parallel to trace 322d extend beneath UBM 302 to provide sufficient structural reinforcement for UBM 322 and routing layer 308, as best appreciated with reference to FIG. 11. Trace 322d acting as a bump-pad need not be any larger than the remaining traces 322 and need not physically terminate beneath under bump metallization 302, but may instead extend from an I/O pad 314d to a contact point for an associated UBM, and potentially beyond. In this way, a single trace like trace 322d may serve to provide a signal, power, etc. to several UBMs like UBM 302. As well, as traces 322 do not occupy additional space, newly freed space permits increased spacing between traces 322, and possible wider traces, to reduce cross-talk, and increase power carried by traces 322. As will be appreciated, reinforcing traces 322 need not be parallel but could otherwise extend beneath a UBM, like UBM 302, and be geometrically arranged to reinforce dielectric 306 proximate UBM 302.

Advantageously, routing patterns for traces 222/322 as depicted in FIGS. 8-11 permit increased routing density while still absorbing much of the stress from solder bumps that would otherwise negatively impact the increasingly brittle dielectric materials used with smaller dice. Smaller bump-pads 204 or contact points on traces 322 acting as bump pads, allow more routing traces 222/322 for signal, power/ground compared to conventional larger bump-pads. In addition, smaller bump-pads 204/traces 322 will be less capacitive for signal transmission.

The effective resistance of power and ground traces can be reduced by increasing the number of power/ground traces on the routing layer which advantageously leads to more efficient power usage. Moreover, semiconductor dice exemplary of embodiments of the present invention, permit bump-pad shapes that need not conform to the shape of UBM pads formed over them.

Conveniently, the described embodiments may avoid costs associated with adding a Polyimide buffer between a UBM and the routing layer.

As may be appreciated, only one layer of dielectric material 220 and one corresponding layer of conductive traces 222 are depicted in FIGS. 4-5 for clarity. However, persons skilled in the art would readily appreciate that in other embodiments several layers of traces may be arranged insulated from each other by a layer of dielectric material within routing layer 208.

In other embodiments, only some of the bump-pads in routing layer 208 of die 200 may be surrounded by a conductive trace passing proximate the bump-pads. There may be some other bump-pads that do not necessarily have conductive traces passing near their respective UBM, to mechanically reinforce routing layer 208. There may also be other bump-pads that are larger than their corresponding UBM (like bump-pad 104), in addition to exemplary bump-pads 204 that are smaller than the upper surface of their corresponding USM.

Embodiments of the present invention may be used in a variety of applications including the manufacture of DRAM, SRAM, EEPROM, flash memory, graphics processors, general purpose processors, DSPs, and various standard analog, digital and mixed signal circuit packages.

Of course, the above described embodiments are intended to be illustrative only and in no way limiting. The described embodiments of carrying out the invention, are susceptible to many modifications of form, arrangement of parts, details and order of operation. The invention, rather, is intended to encompass all such modification within its scope, as defined by the claims.

What is claimed is:

1. A semiconductor die comprising:
   i) an integrated circuit formed on one surface of a piece of semiconductor wafer;
   ii) a plurality of input-output (I/O) pads interconnected to said integrated circuit;
   iii) a routing layer formed on said semiconductor wafer, said routing layer comprising a layer of dielectric material;
   iv) a plurality of under-bump metallizations (UBMs) formed atop said routing layer, each for attaching a respective one of a plurality of solder bumps;
   v) a plurality of conductive traces, each extending through said routing layer from one of said I/O pads to a contact point for a corresponding one of said UBMs and electrically interconnecting said one of said I/O pads to said corresponding one of said UBMs;
   wherein at least one of said conductive traces passes beneath a reinforced one of said UBMs without electrically contacting said reinforced one of said UBMs, to mechanically reinforce said routing layer proximate said reinforced one of said UBMs.

2. The semiconductor die of claim 1, wherein said routing layer comprises a plurality of layers of conductive traces, each of said layers of conductive traces separated by at least one dielectric layer from another one of said plurality of layers of conductive traces.

3. The semiconductor die of claim 1, wherein said at least some of said conductive traces absorb stress from corresponding ones of said solder bumps resulting from a mismatch in coefficients of thermal expansion of said semiconductor die and a substrate to which said solder bumps are attached.

4. The semiconductor die of claim 1, wherein said at least some of said conductive traces comprise one of a power trace, a ground trace, and a signal trace.

5. The semiconductor die of claim 1, wherein the diameter of a circle inscribed within a top surface of each of said UBMs is about 80 μm and the diameter of a circle inscribed within a bottom contact surface of said each one said UBMs is about 46 μm.

6. The semiconductor die of claim 5, wherein the width of each of said conductive traces is about 12 μm.

7. The semiconductor die of claim 1, wherein said die is attached to said substrate using flip-chip attachment.

8. The semiconductor die of claim 1, wherein said package is one of DRAM, SRAM, EEPROM, flash memory, graphics processor, general purpose processor and DSP.

9. A semiconductor die, comprising:
   i) at least one integrated circuit formed on one surface, and a plurality of input-output (I/O) pads connected to said at least one integrated circuit;
   ii) a routing layer comprising a dielectric layer formed on said surface of said die, and a plurality of conductive traces formed on said dielectric layer, each of said conductive traces extending between one of said I/O pads and one of a plurality of bump-pads formed on said dielectric layer; and
   iii) a plurality of under-bump metallizations (UBMs) formed atop said routing layer; each of said conductive traces extending from one of said I/O pads to a contact point for a corresponding one of said UBMs and electrically interconnecting said one of said I/O pads to said corresponding one of said UBMs;
   iv) a plurality of solder bumps, each formed on said bump-pads, for electrically interconnecting said integrated circuit to a substrate;
   wherein at least one of conductive traces passes beneath a reinforced one of said UBMs without electrically contacting said reinforced one of said UBMs, to mechanically reinforce said routing layer proximate said reinforced one of said UBMs.

10. A routing layer for a semiconductor die, said routing layer comprising:
    a plurality of under-bump metallizations (UBMs) for attaching solder bumps;
    a plurality of conductive traces interconnecting a plurality of input-output (I/O) pads of an integrated circuit formed on a die to contact points for corresponding ones of said UBMs;
    at least one of said conductive traces passing beneath a reinforced one of said UBMs without electrically contacting said reinforced one of said UBMs, to mechanically reinforce said routing layer proximate a corresponding one of said UBMs.

11. The routing layer of claim 10, wherein each of said plurality of conductive traces comprises at least one of: copper, aluminum, gold, lead, tin, silver, bismuth, antimony, zinc, nickel, zirconium, magnesium, indium, tellurium and gallium.

12. The routing layer of claim 10, further comprising a dielectric layer wherein said plurality of conductive traces is formed on said dielectric layer.

13. A semiconductor die comprising, the routing layer of claim 10.

14. A semiconductor die comprising:
    an integrated circuit formed on one surface of a piece of semiconductor wafer;
    a plurality of input-output (I/O) pads interconnected to said integrated circuit;
    a routing layer comprising: a dielectric layer formed on said one surface; and a plurality of conductive traces formed on said dielectric layer, each of said conductive traces extending from one of said I/O pads;
    a plurality of under-bump metallizations (UBMs), each comprising a top surface for attaching a respective one of a plurality of solder bumps;
    wherein at least a first one of said conductive traces passes beneath a plurality of corresponding ones of said UBMs and is electrically interconnected to each of said corresponding ones of said UBMs through said dielectric layer, and wherein each of said corresponding ones of said UBMs has at least a second one of said plurality of conductive traces passing thereunder and proximate said first conductive trace without electrically contacting that one of said UBMs to mechanically reinforce said routing layer proximate said one of said UBMs.

15. A semiconductor die, comprising:
    i) at least one integrated circuit formed on one surface, and a plurality of input-output (I/O) pads connected to said at least one integrated circuit;
    ii) a routing layer comprising a dielectric layer formed on said surface of said die, and a plurality of conductive traces formed on said dielectric layer, each of said conductive traces extending from one of said I/O pads;
    iii) a plurality of under-bump metallizations (UBMs) formed atop said routing layer;

iv) a plurality of solder bumps formed on said UBMs, for electrically interconnecting said integrated circuit to a substrate;

wherein at least a first one of said conductive traces passes beneath a plurality of corresponding ones of said UBMs and is electrically interconnected to each of said corresponding ones of said UBMs through said dielectric layer, and wherein each of said corresponding ones of said UBMs has at least a second one of said plurality of conductive traces passing thereunder and proximate said first conductive trace without electrically contacting that one of said UBMs to mechanically reinforce said routing layer proximate said one of said UBMs.

16. A routing layer for a semiconductor die, said routing layer comprising:

a plurality of under-bump metallizations (UBMs) for attaching solder bumps;

a plurality of conductive traces, each extending from one of a plurality of input-output (I/O) pads of an integrated circuit formed on a die;

at least a first one of said conductive traces passing beneath a plurality of corresponding ones of said UBMs and electrically connected to each of said corresponding ones of said UBMs, and a second one of said conductive traces leave proximate one of said corresponding ones of said UBMs without electrically contacting said one of said corresponding ones of said UBMs, to mechanically reinforce said routing layer proximate thereto.

* * * * *